United States Patent
Han

(10) Patent No.: US 9,567,663 B2
(45) Date of Patent: Feb. 14, 2017

(54) MANUFACTURING APPARATUS AND METHOD OF MASK ASSEMBLY

(71) Applicant: SAMSUNG DISPLAY CO., LTD., Yongin, Gyeonggi-Do (KR)

(72) Inventor: Jeong-Won Han, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 81 days.

(21) Appl. No.: 14/258,092

(22) Filed: Apr. 22, 2014

(65) Prior Publication Data

US 2015/0026947 A1 Jan. 29, 2015

(30) Foreign Application Priority Data

Jul. 25, 2013 (KR) ........................ 10-2013-0088168

(51) Int. Cl.
*H01L 51/56* (2006.01)
*C23C 14/04* (2006.01)
*B05C 21/00* (2006.01)

(52) U.S. Cl.
CPC ........... *C23C 14/042* (2013.01); *B05C 21/005* (2013.01); *Y10T 29/49826* (2015.01); *Y10T 29/53961* (2015.01)

(58) Field of Classification Search
None
See application file for complete search history.

(56) References Cited

U.S. PATENT DOCUMENTS

2012/0279445 A1* 11/2012 Kim .............................. 118/504

FOREIGN PATENT DOCUMENTS

| KR | 20030075221 | * | 9/2003 | ............. H05B 33/10 |
| KR | 1020030075221 | | 9/2003 | |
| KR | 1020070055827 | | 5/2007 | |
| KR | 1020110101767 | | 9/2011 | |

* cited by examiner

*Primary Examiner* — Dah-Wei D Yuan
*Assistant Examiner* — Jethro M Pence
(74) *Attorney, Agent, or Firm* — F. Chau & Associates, LLC

(57) ABSTRACT

A manufacturing apparatus for a mask assembly includes a plurality of mask tensile units configured to apply a tensile force to a mask. A plurality of counterforce application units are configured to apply a counterforce in an opposite direction to the direction of the tensile force to a mask frame to which the mask is attached. The counterforce application units are configured to apply the counterforce to an upper portion of a side of the mask frame.

3 Claims, 5 Drawing Sheets

MANUFACTURING APPARATUS AND METHOD OF MASK ASSEMBLY

CROSS-REFERENCE TO RELATED APPLICATION

This application claims priority under 35 U.S.C. §119 to Korean Patent Application No. 10-2013-0088168 filed in the Korean Intellectual Property Office on Jul. 25, 2013, the disclosure of which is incorporated by reference herein in its entirety.

TECHNICAL FIELD

Exemplary embodiments of the present invention relate to a manufacturing apparatus, and more particularly to a method of mask assembly.

DISCUSSION OF RELATED ART

Examples of a flat panel display include a liquid crystal display (LCD) and an organic light emitting diode (OLED) display. An OLED display, for example, may include a metal layer with a predetermined pattern, and an organic emission layer of the predetermined pattern formed for every pixel. A deposition method using a mask assembly may be used for forming the metal layer and the organic emission layer.

The mask assembly may include a mask with a patterned opening. The patterned opening may be in a shape of a metal layer or an organic emission layer that is to be deposited. The mask assembly may include a frame for supporting the mask. In a state of extending the mask, a mask assembly may be completed by welding the mask onto the mask frame. When the mask is welded to the mask frame in the extended state, the mask frame may be deformed due to an elastic restoration force of the mask. When the mask frame is deformed, positional accuracy of a pattern on the mask may be reduced.

To prevent the deformation of the mask frame, a method of applying a counterforce to the mask frame may be used when welding the mask. The deformation of the mask frame may be prevented even though the elastic restoration force of the mask acts after the welding.

Torsional force may be generated between the mask and the mask frame after the tensile welding of the mask. When viewing a cross-section of the mask frame, the torsional force of the mask frame may cause the mask frame to be rotated with reference to a center axis of the mask frame.

When mounting the mask assembly to perform a deposition process, the mask assembly may be mounted so that the accuracy of the mask frame is decreased due to the mask frame being twisted. Positional accuracy of a deposition layer may be decreased when performing the deposition process.

The amount of torsional force of the mask frame may be large when a distance from the center axis of the torsional force to an action point where the force acts is large. As the thickness of the mask frame is increased to reduce the deformation of the horizontal direction of the mask frame caused by the mask torsional force, the torsional deformation by the mask frame due to the mask may be increased.

SUMMARY

Exemplary embodiments of the present invention provide a manufacturing apparatus of a mask assembly preventing torsional force of a mask frame after tensile welding of a mask, and a method of mask assembly.

A manufacturing apparatus of a mask assembly according to an exemplary embodiment of the present invention includes a plurality of mask tensile units configured to apply a tensile force to a mask. A plurality of counterforce application units are configured to apply a counterforce in an opposite direction to the direction of the tensile force to a mask frame to which the mask is attached. The counterforce application units are configured to apply the counterforce to an upper portion of a side of the mask frame.

The counterforce application units may include a horizontal counterforce application unit configured to contact the upper portion of the side of the mask frame to apply the counterforce. An application unit position controller is configured to control a horizontal position and a vertical position of the horizontal counterforce application unit.

The application unit position controller may include a horizontal position controller coupled to the horizontal counterforce application unit. The horizontal position controller may be configured to move in a right and left direction. A vertical position controller may be coupled to the horizontal position controller. The vertical position controller may be configured to move in an up and down direction.

A manufacturing method of a mask assembly according to an exemplary embodiment of the present invention includes applying a tensile force to a mask. The tensile force is applied to the mask by a plurality of mask tensile units. A counterforce is applied to the mask frame in an opposite direction to the direction of the tensile force. The counterforce is applied to an upper portion of a side of the mask frame by a plurality of counterforce application units. The manufacturing method includes attaching the mask to the mask frame.

The counterforce may be applied to the upper portion of the side of the mask frame by a horizontal counterforce application unit. The vertical position of the horizontal counterforce application unit may be controlled by a vertical position controller.

The upper portion of the side of the mask frame may be parallel to a portion of the side of the mask frame above a center axis of a cross-section of the mask frame.

BRIEF DESCRIPTION OF THE DRAWINGS

The above and other features of the invention will become more apparent by describing in detail exemplary embodiments thereof, with reference to the accompanying drawings in which.

DETAILED DESCRIPTION OF THE EMBODIMENTS

The present invention will be described more fully hereinafter with reference to the accompanying drawings, in which exemplary embodiments of the invention are shown. As those skilled in the art will realize, the described embodiments may be modified in various different forms without departing from the spirit or scope of the present invention.

It will be understood that when an element such as, for example, a layer, film, region, or substrate is referred to as being "on" another element, it may be directly on the other element or intervening elements may also be present.

Figure 1:
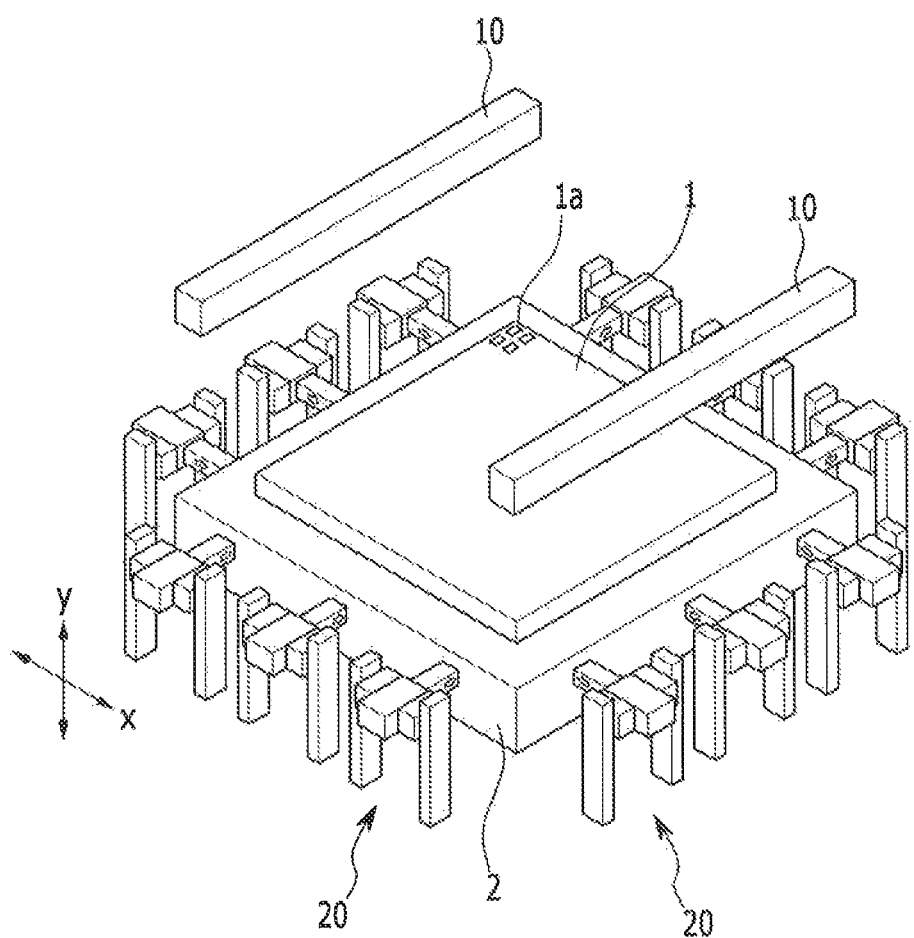
FIG. 1 is a perspective view of a manufacturing apparatus of a mask assembly according to an exemplary embodiment of the present invention.
Figure 2:
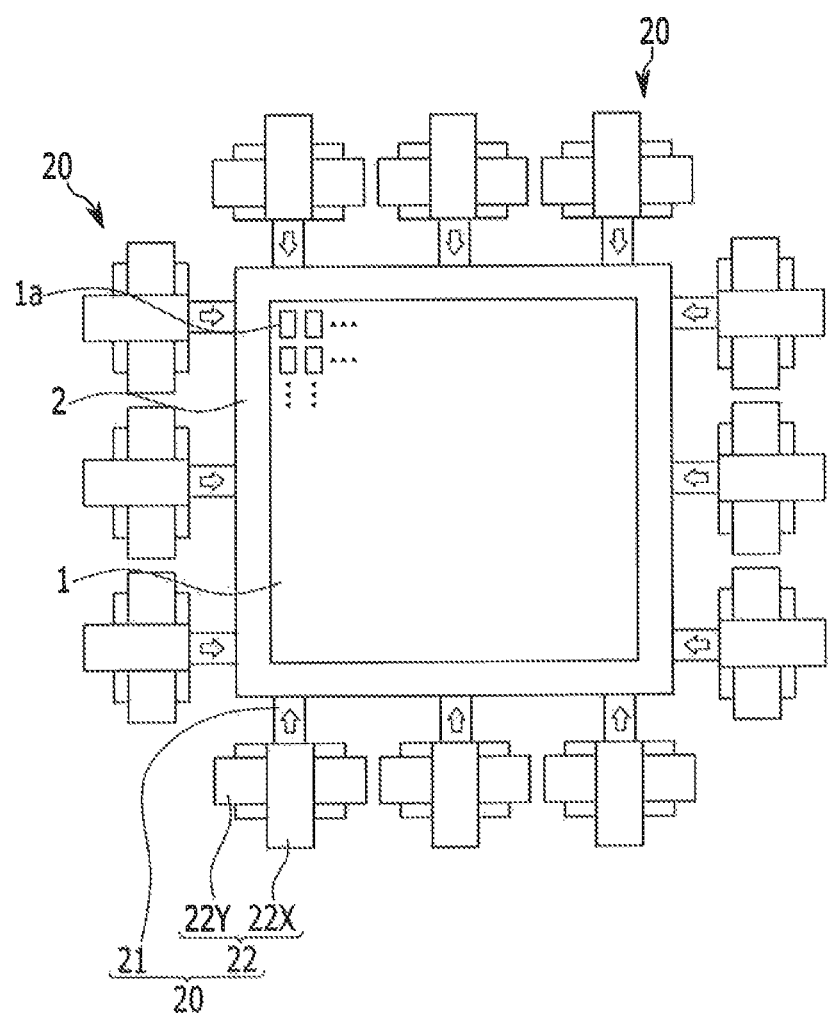
FIG. 2 is a top plan view of a manufacturing apparatus of a mask assembly according to an exemplary embodiment of the present invention.
Figure 3:
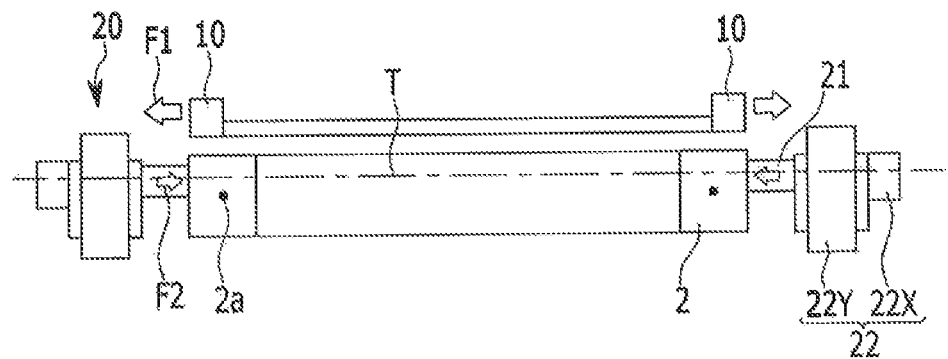
FIG. 3 is a cross-sectional view of a manufacturing apparatus of a mask assembly according to an exemplary embodiment of the present invention.

FIG. 1 is a perspective view of a manufacturing apparatus of a mask assembly according to an exemplary embodiment of the present invention, FIG. 2 is a top plan view of a manufacturing apparatus of a mask assembly according to an exemplary embodiment of the present invention, and FIG. 3 is a cross-sectional view of a manufacturing apparatus of a mask assembly according to an exemplary embodiment of the present invention.

As shown in FIG. 1 to FIG. 3, a manufacturing apparatus of a mask assembly according to an exemplary embodiment of the present invention includes a plurality of mask tensile units 10 configured to apply a tensile force F1 to a mask 1. The manufacturing apparatus of a mask assembly includes a plurality of counterforce application units 20 configured to apply a counterforce F2 to a mask frame 2 to which the mask 1 is attached. The counterforce F2 is applied in an opposite direction to the direction of the tensile force F1.

The mask tensile units 10 may extend both sides of the mask 1 in opposite directions. The mask tensile units 10 may prevent a center of the mask 1 from sinking due to the weight of the mask 1. The mask 1 may be formed of a thin metal plate material of a quadrangular shape, and may include a plurality of pattern openings 1a. The plurality of pattern openings 1a may be a plurality of minute openings, and each minute opening may be formed of the same shape as a thin film to be deposited. In the deposition process, a deposition material may pass through the pattern opening 1a and may be deposited on a substrate (not shown) such that the thin film (e.g., a metal layer or an organic emission layer) of a desired shape may be formed.

By extending the mask 1 by using the mask tensile units 10, deformation of the pattern opening 1a of the mask 1 may be prevented such that deterioration of a positional accuracy of the pattern opening 1a of the mask 1 may be prevented.

The counterforce application units 20 may be installed at side surfaces of the mask frame 2. The counterforce application units 20 may include a horizontal counterforce application unit 21 contacting an upper portion of a side surface of the mask frame 2. The horizontal counterforce application unit 21 may apply a counterforce F2. The counterforce application units 20 may include an application unit position controller 22. The application unit position controller 22 may control a horizontal position and a vertical position of the horizontal counterforce application unit 21.

The mask frame 2 may have a square shape, for example, that is larger than a size of the mask 1. The mask 1 may be fixed to the mask frame 2 by welding, for example. The upper portion of the side surface of the mask frame 2 where the horizontal counterforce application unit 21 applies the counterforce F2 to the mask frame 2 may be positioned at a position T. Position T may be parallel to an upper portion of a center axis 2a of the cross-section of the mask frame 2.

The application unit position controller 22 may include a horizontal position controller 22X connected to the horizontal counterforce application unit 21. The horizontal position controller 22X may move in a right and left direction and may control a horizontal position X. The application unit position controller 22 may include a vertical position controller 22Y to which both sides of the horizontal position controller 22X are coupled. The vertical position controller 22Y may move in an up and down direction and may control a vertical position Y.

As described above, the counterforce application units 20 may apply the counterforce F2 to the side upper portion of the mask frame 2. The counterforce F2 may counteract the torsion of the mask frame 2 that may be welded to the mask 1 extended by the mask tensile unit 10. The counterforce application units 20 may apply torsion of the opposite direction to the mask frame 2. The deformation caused by the torsional force of the mask frame 2 may be prevented. The deformation in the horizontal direction of the mask frame 2 caused by the extended mask 1 may be prevented.

When the thickness of the mask frame 2 is increased, the counterforce application units 20 may control the vertical position of the counterforce F2 applied to the mask frame 2 such that the torsion of the mask frame 2 may be prevented. The thickness of the mask frame 2 may be increased while counteracting the torsional force of the mask frame 2.

The configuration of the application unit position controller 22 is not restricted to the exemplary embodiments of the present invention, and any configurations for moving the horizontal counterforce application unit 21 in the up and down and right and left directions are applicable.

Figure 4:
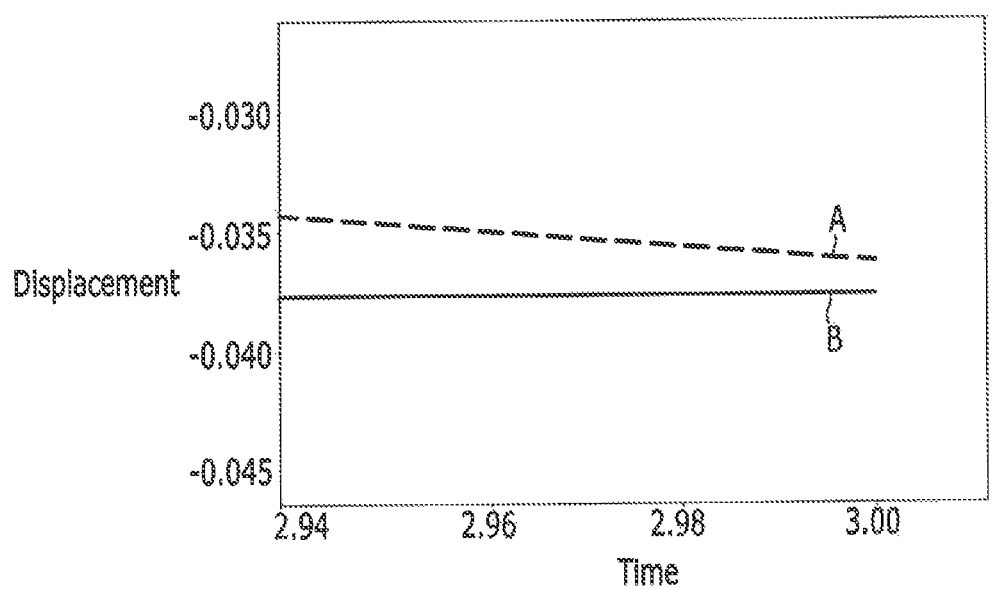
FIG. 4 is a graph of a positional deformation amount of a mask frame when applying a first counterforce to a center axis of a cross-section of the mask frame and applying a second counterforce to an uppermost portion of the mask frame by a manufacturing apparatus of a mask assembly according to an exemplary embodiment of the present invention.

FIG. 4 is a graph of a positional deformation amount of a mask frame when applying a first counterforce to a center axis of a cross-section of the mask frame and applying a second counterforce to an uppermost portion of the mask frame by a manufacturing apparatus of a mask assembly according to an exemplary embodiment of the present invention.

A Y-axis in FIG. 4 is an axis representing a position change amount of the mask frame. A unit of the Y-axis is a micrometer (μm). An X-axis is an axis representing a time that a measurement is performed. A unit of the X-axis is seconds.

As shown in FIG. 4, the position change amount of the mask frame 2 is larger in a case (B) of applying the first counterforce F2 to the center axis of the cross-section of the mask frame 2 than in a case (A) of applying the second counterforce F2 to the uppermost portion of the mask frame 2. When applying the counterforce F2 to the uppermost portion of the mask frame 2, the torsion of the mask frame 2 may be minimized.

A manufacturing method of a mask assembly according to an exemplary embodiment of the present invention will now be described with reference to FIG. 5.

Figure 5:
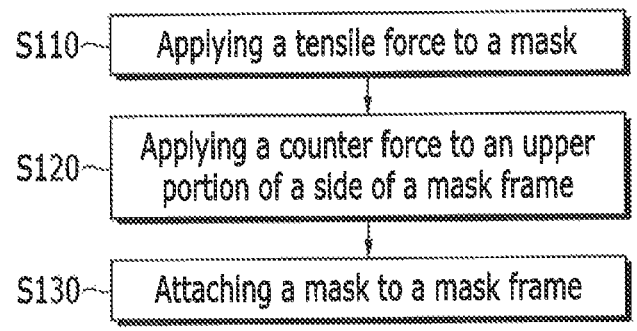
FIG. 5 is a flowchart of a manufacturing method of a mask assembly according to an exemplary embodiment of the present invention.

FIG. 5 is a flowchart of a manufacturing method of a mask assembly according to an exemplary embodiment of the present invention.

As shown in FIG. 5, in a manufacturing method of a mask assembly according to an exemplary embodiment of the present invention, a tensile force F1 is applied to a mask 1 by using a plurality of mask tensile units 10 (S110). Drooping of the center portion of the mask 1 because of the weight of the mask 1 may be prevented.

A counterforce F2 is applied in the opposite direction of the tensile force F1 to the upper portion of a side of the mask frame 2 to which the mask 1 is attached by using a plurality of counterforce application units 20 (S120).

The counterforce F2 may be applied to the upper portion of the side of the mask frame 2 by controlling the vertical position of the counterforce application units 20. The upper portion of the side of the mask frame 2 may be a position parallel to the upper portion of the center axis 2a of the cross-section of the mask frame 2.

As described above, the counterforce F2 may be applied to the upper portion of the side of the mask frame 2 by using the counterforce application units 20. The counterforce F2 may counteract the torsional force of the mask frame 2. The counterforce F2 may be applied in a direction opposite to the direction of the torsional force of the mask frame 2. The deformation caused by the torsional force of the mask frame 2 may be prevented and the deformation in the horizontal direction caused by the extended mask 1 may be prevented.

Next, the mask 1 may be attached to the mask frame 2 by, for example, welding.

The manufacturing apparatus and the method of mask assembly may apply the counterforce F2 to the upper portion of the side of the mask frame 2 by using the counterforce application units 20 according to exemplary embodiments of the present invention. The counterforce F2 may be applied in a direction that is opposite to the direction of the torsional force of the mask frame 2. The deformation caused by the torsional force of the mask frame 2, as well as the deformation in the horizontal direction of the mask frame 2 caused by the extended mask 1 may be prevented.

When the thickness of the mask frame 2 is increased, the torsional force of the mask frame 2 may be counteracted by controlling the vertical position of the counterforce F2 applied by the counterforce application units 20. The torsional force of the mask frame 2 may be prevented such that the thickness of the mask frame 2 may be increased while preventing the torsional force of the mask frame 2.

While the present invention has been particularly shown and described with reference to exemplary embodiments thereof, it will be understood by those of ordinary skill in the art that various changes in form and detail may be made therein without departing from the spirit and scope of the present invention.

What is claimed is:

1. A manufacturing apparatus for a mask assembly, comprising:
   a plurality of mask tensile units configured to apply a tensile force to a mask;
   a plurality of counterforce application units configured to apply a counterforce in an opposite direction to a direction of the tensile force to a mask frame to which the mask is attached,
   wherein the plurality of counterforce application units are configured to apply the counterforce to an upper portion of a side of the mask frame; and
   a plurality of application unit position controllers, wherein each of the application unit position controllers includes a vertical position controller configured to control a vertical position of a counterforce application unit of the plurality of counterforce application units in contact with the side surface of the mask frame, and wherein the vertical position controller is configured to adjust the vertical position of the counterforce application unit of the plurality of counterforce application units to contact different vertical positions along the side of the mask frame.

2. The manufacturing apparatus of claim 1, wherein the plurality of counterforce application units each include:
   a horizontal counterforce application unit configured to contact the upper portion of the side of the mask frame to apply the counterforce; and
   wherein each of the application unit position controllers is configured to control a horizontal position of the horizontal counterforce application unit.

3. The manufacturing apparatus of claim 2, wherein each of the application unit position controllers includes:
   a horizontal position controller coupled to the horizontal counterforce application unit, the horizontal position controller configured to move in a right and left direction.

* * * * *